(12) United States Patent
Deguenther et al.

(10) Patent No.: US 8,773,639 B2
(45) Date of Patent: Jul. 8, 2014

(54) ILLUMINATION SYSTEM OF A MICROLITHOGRAPHIC PROJECTION EXPOSURE APPARATUS

(75) Inventors: Markus Deguenther, Aalen (DE);
Andras G. Major, Oberkochen (DE);
Anne Christine Andresen, Westensee (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 776 days.

(21) Appl. No.: 12/632,055

(22) Filed: Dec. 7, 2009

(65) Prior Publication Data

US 2010/0103400 A1  Apr. 29, 2010

Related U.S. Application Data

(63) Continuation of application No. PCT/EP2008/006183, filed on Jul. 28, 2008.

(60) Provisional application No. 60/954,150, filed on Aug. 6, 2007, provisional application No. 61/016,099, filed on Dec. 21, 2007.

(30) Foreign Application Priority Data

Aug. 2, 2007  (DE) .......................... 10 2007 036 245

(51) Int. Cl.
*G03B 27/72* (2006.01)

(52) U.S. Cl.
USPC ............................................. 355/71; 355/67

(58) Field of Classification Search
CPC .... G03F 7/7015; G03F 7/70191; G03F 7/702
USPC ........................................ 355/67, 71; 359/237
See application file for complete search history.

(56) References Cited

U.S. PATENT DOCUMENTS

| 5,659,374 | A | * | 8/1997 | Gale et al. | ..................... 359/290 |
| 6,965,119 | B2 | | 11/2005 | Sandstrom | |
| 2002/0036763 | A1 | * | 3/2002 | Krikke et al. | .................. 355/67 |
| 2003/0038225 | A1 | * | 2/2003 | Mulder et al. | ................ 250/205 |
| 2004/0057034 | A1 | | 3/2004 | Zinn et al. | |
| 2004/0130810 | A1 | * | 7/2004 | Valette | .......................... 359/432 |
| 2004/0207386 | A1 | | 10/2004 | Durr | |
| 2006/0050261 | A1 | | 3/2006 | Brotsack | |
| 2008/0304030 | A1 | | 12/2008 | Lous | |

FOREIGN PATENT DOCUMENTS

| EP | 1 426 826 | | 6/2004 |
| EP | 1 975 724 | | 10/2008 |
| JP | 10022209 A | * | 1/1998 |
| WO | WO 2005/026843 | | 3/2005 |
| WO | WO 2006/120634 | | 11/2006 |

* cited by examiner

*Primary Examiner* — Glen Kao
(74) *Attorney, Agent, or Firm* — Fish & Richardson P.C.

(57) ABSTRACT

An illumination system of a microlithographic projection exposure apparatus comprises a pupil surface and an arrangement of individually drivable beam deviating elements. Each beam deviating element is configured to direct light impinging thereon onto different positions on the pupil surface in response to a control signal applied to the beam deviating element. According to the disclosure an attenuation unit is provided which is configured to reduce the intensity of light, which is directed by any arbitrary beam deviating element (onto the pupil surface, by more than 50%. This makes it possible to reduce the intensity of light in the pupil surface that has been reflected by defective beam deviating elements.

21 Claims, 13 Drawing Sheets

ILLUMINATION SYSTEM OF A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2008/006183, filed Jul. 28, 2008, which claims benefit of German Application No. 10 2007 036 245.7, filed Aug. 2, 2007; U.S. Ser. No. 60/954,150, filed Aug. 6, 2007 and 61/016,099, filed Dec. 21, 2007. International application PCT/EP2008/006183 is hereby incorporated by reference in its entirety.

FIELD

The disclosure relates to an illumination system of microlithographic projection exposure apparatus. More particularly, the disclosure relates to an illumination system which includes an arrangement of beam deviating elements, for example micromirror arrays, for variably illuminating a system pupil surface of the illumination system.

BACKGROUND

Projection exposure apparatus making it possible to produce microstructures on semiconductor components are known from the prior art. These structures are conventionally produced by imaging a mask, with structures arranged on it, through a projection objective of the projection exposure apparatus onto a photosensitive layer, which is supported by a semiconductor component.

WO 2005/026843 A2 discloses an illumination system including a multiple mirror arrangement, which is sometimes also referred to as multi-mirror array (MMA). Each micromirror of this arrangement can be tilted about two orthogonal tilt axes. This makes it possible to variably illuminate a system pupil plane of the illumination system without incurring a substantial loss of light. Since the intensity distribution in the system pupil plane translated into a angular distribution in a subsequent mask plane in which the mask is to be positioned, the position of the micromirrors determine the angular distribution of light in the mask plane.

It is desirable for the micromirrors are tilted with extremely high positional precision and long-term stability. If there are inaccuracies in the alignment of the micromirrors, this causes a displacement of the light spots in the pupil plane, which can have an unfavorable effect on the imaging of the mask.

SUMMARY

In some embodiments, the disclosure provides an illumination system which makes it possible to stably maintain desired illumination angle distributions in a mask plane.

In certain embodiments, the disclosure provides an illumination system of a microlithographic projection exposure apparatus, which includes a pupil surface and an arrangement of individually drivable beam deviating elements. Each beam deviating element is configured to direct light impinging thereon onto different positions on the pupil surface in response to a control signal applied to the beam deviating element. According to the disclosure an attenuation unit is provided which is configured to reduce the intensity of light, which is directed by any arbitrary beam deviating element onto the pupil surface, by more than 50%.

The task of the attenuation unit is thus to attenuate light in the pupil surface that has been reflected from defective beam deviating elements. Because a defect of a beam deviating element usually results in light that is directed on locations in the pupil surfaces where it should not pass through, a reduction of the light intensity associated with this light improves the illumination angle distribution in the mask plane. This reduction can be complete, i.e. no such light at all reaches the pupil plane. This may be achieved, for example, by absorbing this light or by directing this light to a region outside the usable pupil surface where it is absorbed.

The intensity reduction may be achieved by measures which relate to varying the direction and/or to reducing the intensity of the light rays striking any of the beam deviating elements, or by measures which relate to varying the direction and/or reducing the intensity of the light rays reflected from any of the beam deviating elements. In both cases it is ensured that the light rays assigned to a defective beam deviating element do not strike, or only partially strike the usable region of the pupil surface.

If the intensity of the light rays reflected from any of the beam deviating elements shall be reduced, this may be accomplished by varying at least one tilt angle of the defective beam deviating element and/or reducing the reflectivity of the respective beam deviating element and/or arranging an element which at least partially absorbs or reflects the light rays associated with the defective beam deviating element.

The measures taken in this respect may be reversible or irreversible.

A reversible measure may be ended when a beam deviating element is working correctly again after a malfunction has occurred. Such a malfunction may occur by exceeding or falling below a predeterminable operating temperature for the beam deviating elements. During this period of time, individual beam deviating elements may sometimes not be drivable correctly.

An irreversible measure will be carried out when a fault occurring on the beam deviating element is not correctable, for example when an electronic driver of the beam deviating element has failed.

According to one embodiment, the attenuation unit is configured to reduce the intensity of light, which is directed by any arbitrary beam deviating element onto the pupil surface, by more than 75% (e.g., by more than 95%, by more than 99%).

In one embodiment the attenuation unit contains a further arrangement of individually drivable beam deviating elements and imaging optics (51), which optically conjugate the two arrangements of beam deviating elements with one another. The second arrangement of individually drivable beam deviating elements may in particular be a micromirror array having tiltable micromirrors or a microlens array having microlenses which can be swivelled individually or have their refracting power varied individually, which act in the manner of digital switches.

The beam deviating elements of the further arrangement may be configured such that they can be switched so that light striking a beam deviating element of the further arrangement either strikes a beam deviating element, associated by the optical conjugation, in the other arrangement, or does not strike the other arrangement at all.

According to another embodiment, the attenuation unit includes a diaphragm unit which is configured to exclusively block light striking an individual beam deviating element. The diaphragm unit makes it possible to affect the optical transmission of the light path respectively formed individually between the light source, the respective beam deviating element and the pupil surface. The number and/or intensity of the light rays striking the respective beam deviating element can thus be temporarily and individually reduced by the diaphragm unit.

According to another embodiment, the diaphragm unit includes a diaphragm and a diaphragm holder which is configured to receive the diaphragm. The diaphragm may in particular be provided as a support material with locally applied attenuating or blocking elements, in particular with a light-absorbent coating. The diaphragm may also be designed as a honeycombed arrangement of transmission openings for the individual light paths, in which case the transmission openings can be closed by insertable blocking elements. In some embodiments, the diaphragm is produced in the manner of a photo slide with a support made of a material which is at least almost fully optically transparent for the light from the light source, and can be provided with an optically opaque coating in those regions in which light passing through would otherwise strike the defective beam deviating elements.

According to another embodiment, the diaphragm unit includes a switchable diaphragm which is arranged permanently in the beam path and has a transmissivity which can be varied locally by applying a control signal. Here, it is advantageous that the individual light paths can be affected without needing to remove or replace the diaphragm unit. Rather, the local transmissivity of the diaphragm instrument is influenced merely by applying a corresponding control signal. The switchable diaphragm may be include an LCD panel (liquid crystal element), in which liquid crystal regions arranged in a matrix can be driven individually and make it possible to locally attenuate or optionally fully prevent transmission of the light when driven correspondingly.

According to another embodiment, the illumination system contains an arrangement of microlenses, each microlens being assigned to one beam deviating element, and the attenuation unit includes a device by which the optical properties of individual microlenses can be modified. The device can include an application instrument for applying a light-absorbent coating onto individual microlenses. The optical transmission of the microlenses is varied individually with such an attenuation unit, so that microlenses through which light would strike defective beam deviating elements are optically blocked.

According to another embodiment, the attenuation unit is configured to modify the optical properties of any of the relevant beam deviating elements. Here, it is advantageous that no optical instruments such as diaphragms, lenses or mirrors need to be introduced into the light paths for those beam deviating elements which are functioning properly, so that any negative impact on the overall optical system can be kept very small. The light rays whose light path includes a defective beam deviating element, which cannot be deflected into the desired direction, should not strike the pupil surface in an uncontrolled fashion. In order to prevent this, the respectively associated beam deviating element has its optical properties modified so that only a fraction of the incident light rays, or even none of the incident light rays, are reflected or otherwise deviated; rather, they are at least partially or fully absorbed or are deviated so that they cannot reach the pupil surface.

According to another embodiment, a light-absorbing layer can be applied onto any of the beam deviating element by the attenuation unit. This may in particular be done by applying a light-absorbing film such as a light-absorbing lacquer layer. The corresponding layer may be applied by a manipulator, which is assigned to the arrangement of beam deviating elements and carries an applicator which can be moved in particular at least along a principal extent direction of the arrangement of beam deviating elements as a function of a control signal. The applicator may be designed as an instrument for applying film sections or ink onto the respective beam deviating elements Ink may be applied contactlessly by spraying or by dropping the ink or, in the manner of a printing process, by applying the ink with a suitable printing pad.

According to another embodiment, a light-deviating optical element can be applied onto the relevant beam deviating element by the attenuation unit. The light-deviating optical element may in particular be a prefabricated component with a suitable shape, for example a glass wedge, an auxiliary mirror, or (in the case of transmitting beam deviating elements) a scattering element. The light-deviating optical element may be formed from a shapeless, optionally curable compound onto the surface of the beam deviating element such that it is at least essentially geometrically stable after a certain time.

According to another embodiment, the relevant beam deviating element can be destroyed by the attenuation unit. The destruction of the deviating element may in particular be induced by mechanical forces, electrical currents, chemical reactions or action of heat. A manipulator can be provided, which carries an applicator with the aid of which the selective destruction of individual beam deviating elements can be carried out. The destructive effect may be directed onto an optical surface of the beam deviating element or, in the case of position-variable beam deviating elements, onto their mechanical suspension.

According to another embodiment, light can be directed by the attenuation unit onto any of the beam deviating elements so that a defective beam deviating element is destroyed by the light chemically or by action of heat. The light used for the destruction may be the light provided by the light source of the illumination system. The attenuation unit may also include its own light source for generating the light. This light source may have its power and wavelength adapted so as to destroy an optical surface or a reflective layer of the beam deviating element.

According to another embodiment, the attenuation unit includes a mirror instrument which can be inserted into the beam path between the beam deviating elements and the pupil surface, and the beam deviating elements can be driven such that they can direct the light onto the inserted mirror instrument in such a way that the light reflected back by the mirror instrument exclusively impinges on the beam deviating element to be destroyed. An additional light source is not therefore required; rather, the light provided by the light source of the illumination system is used to destroy the defective beam deviating element.

The mirror instrument may in particular be designed as a plane mirror, as a curved mirror or as an arrangement of individual mirrors. The mirror instrument can be translated or rotated into the beam path in a motorized fashion.

According to another embodiment, the attenuation unit includes an actuation element, which can be arranged in the immediate vicinity of any of the beam deviating elements with the aid of a displacement device. The displacement device may be a manipulator, which has at least one rotational and/or at least one translational movement degree of freedom and can bring the actuation element from an idle position away from the beam deviating elements into an active position immediately next to the defective beam deviating element.

The beam deviating elements can be designed as tiltable mirrors including a mirror support and a reflective coating. In the event of a malfunction, the actuation element at least partially destroys the reflective coating of any of the mirrors so that the reflectivity of the coating is reduced by at least 50%.

According to another embodiment, a defective mirror can be tilted by direct mechanical action of the actuation element into a position in which the relevant mirror can no longer direct light into the pupil surface. Here, by exerting a force on the respective mirror, a suspension provided for aligning the mirror is permanently deformed or otherwise disabled so that the mirror can no longer deviate the incident light rays onto the pupil surface.

As has been mentioned above, light coming from a defective beam deviating element may be prevented by the attenuation unit from striking the pupil surface. This may be achieved by configuring the attenuation unit as a diaphragm unit, which is arranged between the beam deviating elements and the pupil surface and which is configured to exclusively block light coming any of the beam deviating elements.

The diaphragm unit may be arranged in or in the immediate vicinity of the pupil surface and may include a number of surface regions, the optical transmission of which is adjustable, as is the case particularly with an LCD panel. The number of adjustable surface regions corresponds at least to the number of beam deviating elements provided for deviating the light rays. The number of drivable surface regions can exceed the number of beam deviating elements by a multiple. If the illumination is nevertheless intended to take place at the position where a defective beam deviating element illuminates the pupil surface, then the corresponding surface region of the diaphragm unit will be reset to being transmissive in order to allow illumination of this position. The defective beam deviating element may then even re-contribute to the illumination of the pupil surface.

A further aspect of the disclosure provides a method for operating a microlithographic projection exposure apparatus which includes an illumination system having a pupil surface and including an arrangement of individually drivable beam deviating elements, wherein each beam deviating element is configured to direct light impinging thereon onto different positions on the pupil surface in response to a control signal applied to the beam deviating element. According to the disclosure, the functional status of the beam deviating elements is determined constantly or at intervals in a step a). In particular, it is possible to check whether the beam deviating elements do deviate incident light rays to desired spots in the pupil surface. A subsequent step determines whether the functional status determined in step a) satisfies predetermined threshold criteria. The threshold criterion provided may, for example, be that the beam deviating element can or cannot direct the light rays to be deviated into a spot of predeterminable size, as a function of the respectively associated control signal. If the beam deviating element cannot be deviated suitably for this and compensation for the malfunction of the beam deviating element cannot be carried out in another way, it is established that the functional status of a beam deviating element does not satisfy the predetermined threshold criteria.

In this case the intensity of light directed by this particular beam deviating element onto the pupil surface is attenuated by more than 50% using suitable measures, so that any perturbing effect of the misguided light is reduced.

If the threshold criterion is not satisfied, light may be either entirely prevented from being directed by the beam deviating element onto the pupil surface, or light may be prevented from striking the relevant beam deviating element.

If the at least one threshold criterion is not satisfied, light striking the relevant beam deviating element may be prevented from being transmitted or reflected by it. This may be done by affecting an optical surface or an optical layer of the defective beam deviating element. As an alternative or in addition, if the at least one threshold criterion is not satisfied, provision may be made to prevent light coming from the defective beam deviating element from striking the pupil surface.

According to another aspect of the disclosure, an illumination system of a microlithographic projection exposure is provided includes a first optical system that is configured to produce a bundle of N individual input light beams, wherein N is a positive integer. The illumination system further includes an arrangement of N individually drivable beam deviating elements, wherein the arrangement is configured to produce from the bundle of N individual input light beams a bundle of N individual output light beams whose directions are variable by control signals applied to the beam deviating elements. The beam deviating elements may be arranged as a matrix, for example an m×n matrix having m columns and n lines. A beam extinction unit is configured to reduce the number of output light beams by k, with $1 \leq k \leq N$.

In one embodiment the beam extinction unit is configured to reduce the number of output light beams by reducing the number of input light beams that impinge on the arrangement of beam deviating elements. This may be achieved by blocking light beams with the aid of a diaphragm, for example an LCD panel, on their way between the first optical system and the arrangement of beam deviating elements.

In another embodiment, the beam extinction unit is configured to reduce the number of output light beams by (optionally irreversibly) disabling k beam deviating elements, for example by applying an absorbing layer on an optical surface of the k elements.

In some embodiments, the disclosure provides an illumination system for monitoring multi-mirror arrangements in such a system which makes it possible to efficiently determine and check the deflection produced by the micromirrors or other beam deviating elements.

In certain embodiments, the disclosure provides an illumination system including a pupil surface and an arrangement of individually drivable beam deviating elements. Each beam deviating element is configured to direct primary light impinging thereon onto different positions on the pupil surface in response to a control signal applied to the beam deviating element. According to this aspect of the disclosure, a first detector instrument is arranged outside a beam path of the primary light which eventually illuminates the mask. The first detector instrument is configured and arranged in such a way that primary light reflected by a single beam deflecting element alone can be directed onto the first detector instrument.

The disclosure is based on the discovery that exact monitoring of the deflection produced by a beam deflection element (in the case of micromirrors this corresponds to the position (i.e. alignment) of the micromirrors) can be carried out exactly only if at least some of the deflected primary light is actually used for determining the alignment, since only in this case the relationship between incidence directions of primary light and directions of the deflected primary light can be determined. In order to ensure that only a small portion of the primary light is not available for illuminating the mask, the disclosure proposes to control only individual the beam deviating elements (in the case of micromirrors: to orient only individual micromirrors) periodically so that the incident primary light is directed onto the first detector instrument. In this way, it is possible to successively obtain a relationship of the primary light incidence directions and the deflection produced by the beam deviating elements.

In order to avoid perturbations of the reflected primary light and to allow measurement during operation of the beam deviating elements, the first detector instrument is arranged outside the beam path of the reflected primary light. It is to be understood that the aforementioned relationship is determined for a configuration of a beam deviating element in which the deviated light does not contribute to the illumination of the mask. However, it is possible carry out measurements at different configurations of the beam deviating element (in the case or micromirrors: different alignments). Then a measurement curve may be determined which can be extrapolated/interpolated to the configurations of the beam deviating elements in which it directs primary light into the system pupil surface.

Since measuring or monitoring individual beam deviating elements in an arrangement including several thousand to a few million such elements involves that the measurement of all elements or the cycle time for a repeated measurement is very long, this measurement or monitoring principle is suitable essentially for deviations which take place slowly, for example drift processes which occur for example owing to low-frequency perturbations in the frequency range<1 Hz.

In the case of micromirrors, the disclosure makes it possible to determine, based on a predetermined geometry of the micromirrors, the extent to which the incidence direction of the primary ray bundle or the geometry and arrangement of the micromirrors correspond to the given specifications. A corresponding evaluation may be carried out fully automatically by an in particular software-based control, regulating and evaluation unit.

In order to determine high-frequency perturbations as well, for example with a frequency in the range of from 100 Hz to 1000 Hz, and to optimize the measurement and monitoring of the beam deviating elements based on the partially extracted primary light, a second measurement principle may be employed at the same time. This second measurement principle involves monitoring and determining the beam deviating effect produced by the beam deviating elements with the aid of a separate measurement illumination instrument, which includes a light source producing secondary light, which is distinct from the primary light, and a second detector instrument. The secondary light is directed onto the beam deviating elements. The second detector instrument is configured to detect the secondary light after it has been deviated by the beam deviating elements.

Such a measurement may ideally be carried out continuously or at least with a very fast repetition frequency.

The measurement or monitoring with the aid of the first detector instrument may furthermore be correlated with the results of the measurement or monitoring with the aid of the second detector instrument. In particular, the determined data may be used for mutual calibration. In this way, for example, the variation in the deviation of the primary light may be deduced from a pure position change of a micromirror without the need to carry out a measurement using primary light.

By virtue of the high measurement frequency possible which may be obtained with the second measurement principle, high-frequency perturbations can be readily determined and compensated for by a suitable regulating unit.

The incidence direction of the secondary light may differ from the incidence direction of the primary light in angle of incidence and/or azimuthal incidence direction. This allows simple arrangement of the light source producing secondary light and the second detector instrument. In particular the azimuthal incidence direction may differ by a rotation angle of more than 30° (e.g., more than 60°, approximately 90°) around the surface normal of the arrangement of beam deflection elements.

Between the light source producing secondary light and the arrangement of beam deviating elements, or between this arrangement and the first and second detector instrument, an optical system may be provided which allows variable arrangement of the components, or which simplify the measurement or monitoring.

This optical system may include at least one collimator, optionally including a perforated plate and a microlens array so that, for example, the perforated plate is arranged in the focal plane of the microlenses, so as to generate parallel primary light bundles which can be directed onto the individual beam deviating elements.

The optical system which may be arranged between the beam deviating elements and the detector instruments, in particular the second detector instrument, may also serve to allow corresponding use of different types of sensors.

Thus, a position sensor which is arranged in a focal plane of a converging lens, or an array of position sensors arranged next to one another which are arranged in focal planes of a lens array including converging lenses, may be used in order to convert the angle dependency of the reflected secondary light into a position on the position sensor or sensors.

Additional optics may also be provided, which are designed for example as telecentric imaging optics or so-called relay optics, in order to make the arrangement of the detector instrument variable. This is also ensured, for example, when the optical system of the second detector instrument is configured so that the beam deviating elements are imaged onto the converging lenses, while satisfying the Scheimpflug condition.

The sensors of the detector instruments may be either angle-resolving or position-resolving sensors.

BRIEF DESCRIPTION OF THE DRAWINGS

Various features and advantages of the present disclosure may be more readily understood with reference to the following detailed description taken in conjunction with the accompanying drawing in which.

DETAILED DESCRIPTION

Figure 1:
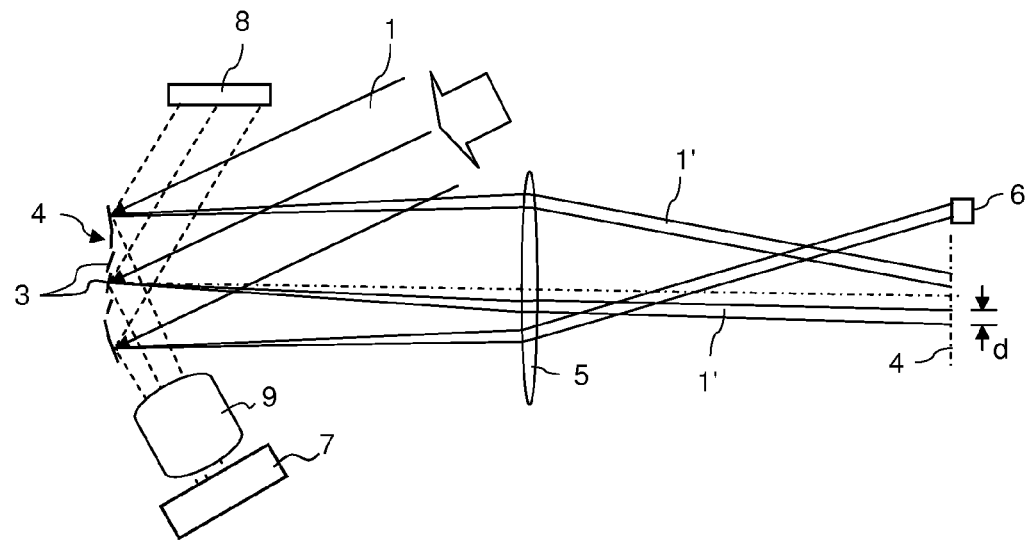
FIG. 1 shows a part of illumination optics.

FIG. 1 is a schematic representation of an optical arrangement which is part of an illumination system of a microlithographic projection exposure apparatus.

Reference numeral 1 denotes a primary light which originates from a light source (not shown) which may be formed by a laser, for example. The primary light 1 is directed onto a multi-mirror arrangement 2 including a plurality of micromirrors 3, which are tiltably arranged for variably illuminating a system pupil plane 4 or a plane which is optically conjugated to the system pupil plane 4. Thus the intensity distribution in the system pupil plane 4 determined the angle distribution of the light bundles that illuminate the mask to be imaged.

The micromirrors 3 can be rotated or tilted about two independent axes so that the individual micromirrors 3 can, at least within certain limits, be freely aligned and oriented. A condenser 5 is arranged between the system pupil plane 4 and the multi-mirror arrangement 2.

The micromirrors 3 may be replaced by any other deflective structure that makes it possible to direct light rays impinging on the structure into various directions, wherein the directions can be changed individually for different portions of the structure upon application of a suitable control signal. Such alternative structures may include, for example, electro-optical or acousto-optical elements. In such elements the refractive index may be varied by exposing a suitable material to ultrasonic waves or electric fields, respectively. These effects can be exploited to produce index gratings that direct impinging light into various directions.

Owing to the great demands on illumination systems in lithography, there are very stringent desired properties regarding the accuracy of the positioning of the micromirrors 3. Furthermore, this accuracy is desirably also maintained over a prolonged period of time, so that there are also stringent desired properties regarding the temporal stability. Accordingly, it is desirable to monitor the setting of the micromirrors particularly in relation to the primary light 1, in order to be able to carry out re-correction if need be by a device of the monitoring result. This may for example be done by a control, regulating and/or evaluation unit (not represented in detail), in which the monitoring result is processed for the individual micromirrors 3.

Two monitoring systems are represented in the embodiment of FIG. 1. These systems may be used individually or together for monitoring the positions of the micromirrors 3.

A first monitoring system is formed by a first detector instrument 6 which is provided outside the usable diameter of the system pupil, but still in the system pupil plane 4. The first detector instrument 6 may, however, also be provided in a plane between the condenser 5 and the system pupil 4, for example.

The first detector instrument 6 is arranged outside the beam path 1' of the primary light which has been reflected by the micromirrors 3 and is used for illuminating the mask. Thus primary light which is directed onto the first detector instrument does not contribute to the illumination of the mask. Primary light can impinge on the first detector instrument 6 and be detected by a sensor contained therein only if one of the micromirrors 3 is deflected beyond its "usual" working settings. Only upon application of special control signals a micromirror 3 deflects primary light 1 onto the first detector instrument 6. By obviating a beam splitter device, which receives all of the reflected light and splits off a constant portion of the primary light 1', only little primary light 1' is lost by the arrangement shown.

The monitoring by the device of the first detector instrument 6 is carried out by adjusting only one or a few micromirrors 3 from time to time, and in particular successively in a regular sequence, so that the reflected light strikes the first detector instrument 6. Based on the intensity of the primary light 1 and the known geometry and tilting properties of the micromirrors 3, it is possible to determine the actual incidence direction of the primary light onto the micromirrors 3. By a series of measurements of the reflected light using the first detector instrument with different positions or settings of a particular micromirror 3, a measurement curve can be recorded which includes the relationship between the incident primary light 1 and the position of the corresponding micromirror 3. If a change in the incidence direction of the primary light 1 or the positioning of the micromirror 3 is induced for example by external influences, this can be established and compensated for by comparison with previous measurement values. This in turn may for example be carried out fully automatically in a corresponding control and/or regulating unit.

Yet since only one micromirror 3 or a few micromirrors 3 at a time respectively extract light from the primary ray bundle 1 for measurement purposes onto the first detector instrument 6, the intensity loss is limited so that this method may also be carried out during operation of the illumination system.

Because changes in the incidence direction of the primary ray bundle 1 or drift changes of the micromirror 3 of the multi-mirror arrangement take place only slowly, it is even sufficient for all the micromirrors 3 of the multi-mirror arrangement 2 to be checked successively at intervals. For example, the checking may be carried out with a frequency of 10 Hz or less.

Besides the first detector instrument, a second measurement instrument is provided which includes a second detector instrument 7 and an auxiliary light source 8.

The auxiliary light source 8 illuminates the multi-mirror arrangement 2 with auxiliary or measurement light, which has a different incidence direction than the primary light 1 so that the auxiliary light reflected by the multi-mirror arrangement 2 reaches the second detector instrument 7. The tilt angles of the micromirrors 3 can be determined from the reflected light of the auxiliary light source 8, which is recorded by the second detector instrument 7. Optics 9 may additionally be provided, in order to make it easier to record and determine the tilt angles of the micromirrors 3. In principle, however, it is also conceivable to operate a second detector instrument 7 without additional optics 9. The method of the measuring arrangement including an auxiliary light source 8 and a second detector instrument 7 with optional optics 9 is described in DE 10 2007 005 875.8, the full disclosure of which being hereby incorporated by reference into the subject-matter of the present application.

Figure 2:
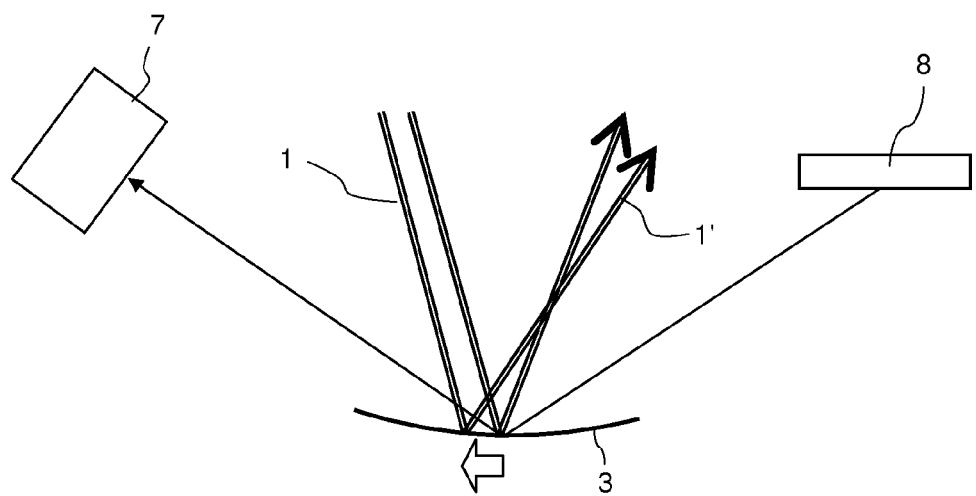
FIG. 2 shows a representation of a micromirror of a multi-mirror arrangement when used according to the disclosure.

By combining the first detector instrument 6 with the second measurement instrument including the auxiliary light source 8 and the second detector instrument 7 as well as optional optics, the recorded data can be mutually calibrated so that discrepancies can be determined more easily and/or it is possible to determine certain discrepancies which otherwise could not. For example, there might be a change in the illumination light incidence due to a drift movement (see arrow in FIG. 2) of the primary light 1 along a non-plane micromirror 3, without it being established per se by the second measurement instrument 7, 8 since in that case the orientation of the micromirror 3 would not change, as represented for example in FIG. 2. Furthermore, however, the second measuring instrument with the auxiliary light source 8 and the second detector instrument 7 offers the possibility of identifying changes in the orientation of the individual micromirrors much more rapidly and earlier, since the auxiliary light allows constant monitoring which is not possible with the first detector instrument 6.

Figure 3:
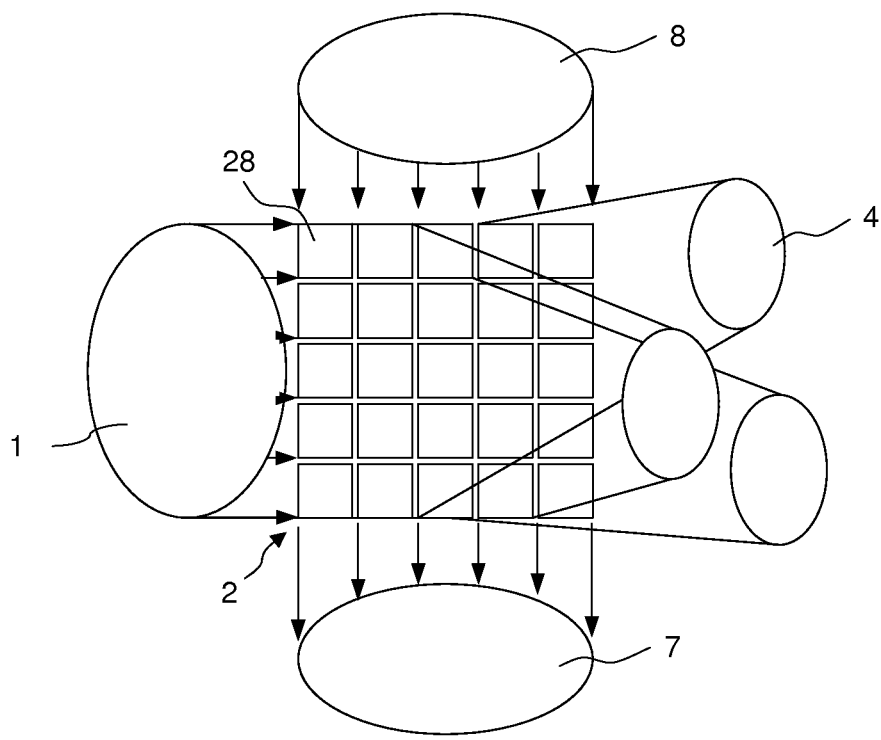
FIG. 3 shows a plan view of a multi-mirror arrangement.

FIG. 3 illustrates the principle of the second measuring arrangement with auxiliary light in a plan view of the multi-mirror arrangement 2. In the embodiment shown in FIG. 3 the measurement light from the auxiliary light source 8 is directed onto the multi-mirror arrangement 2 perpendicularly to the beam path of the primary light 1, and after being reflected from the micromirrors 3 the auxiliary light is detected by corresponding measurement sensors of the second detector instrument 7. The reflected light detected by the second detector instrument 7 contains information about the tilt angle of the micromirrors 3. In the measuring arrangement shown in FIG. 3, the measurement illumination is directed onto the micromirrors 3 in a plane which is rotated by 90° about the surface normal of the multi-mirror arrangement 2 relative to the incidence plane of the primary light 1.

Continuous monitoring of the orientation of the micromirrors 3 is therefore possible even during use of the multi-mirror arrangement 2. Correspondingly, no idle times are required for determining the orientation of the micromirrors 2 and for their adjustment. Since furthermore no primary light 1 is used for determining the orientation of the micromirrors 3, there are also no intensity losses when using the multi-mirror arrangement 2.

Figure 4:
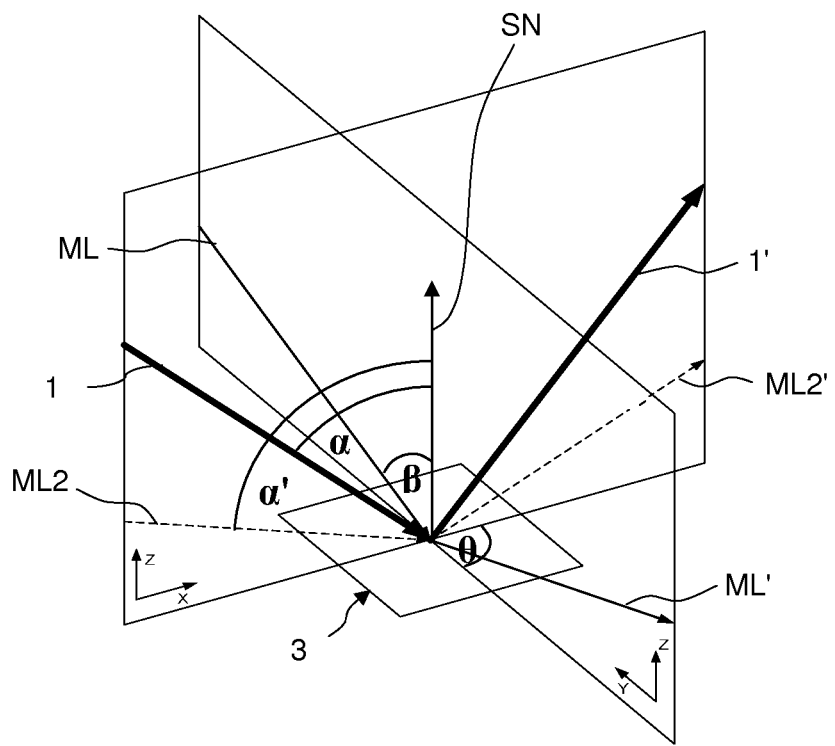
FIG. 4 shows a perspective representation of the mode of action of a measuring arrangement with respect to a micromirror.

FIG. 4 is a perspective representation of the principle of the measuring arrangement using auxiliary radiation. As may be seen from FIG. 4, the primary light 1 strikes the mirror surface of the micromirror 3 at a particular angle of incidence $\alpha$ in the incidence plane (xz plane). After reflection, and is the ray bundle 1 being reflected according to the reflected ray 1' shown. The incidence plane (xz plane) is spanned here by the surface normal SN of the micromirror 3 and the incidence direction of the primary light 1.

Measurement light ML originating from the auxiliary light source 8, which is deviated as reflected light ML' into a corresponding detector instrument 7, propagates in the yz plane which is rotated azimuthally around the surface normal SN of the micromirror 3 by a rotational angle $\theta$ of about 90° relative to the incidence plane (xz plane) of the primary light 1. Besides the difference in the azimuthal incidence direction between the primary light 1 and the measurement light ML, in addition or as an alternative a different angle of incidence may also be selected with respect to the surface normal SN of the micromirror 3. This is represented for a ray if measurement light ML2, which impinges on the micromirror 3 in the same incidence plane as the primary light 1, but has an angle of incidence $\alpha'$ which is different from the angle of incidence $\alpha$ of the primary light. Correspondingly, the reflected measurement beam ML2' also emerges at a different angle from the reflected primary light 3.

Figure 5:
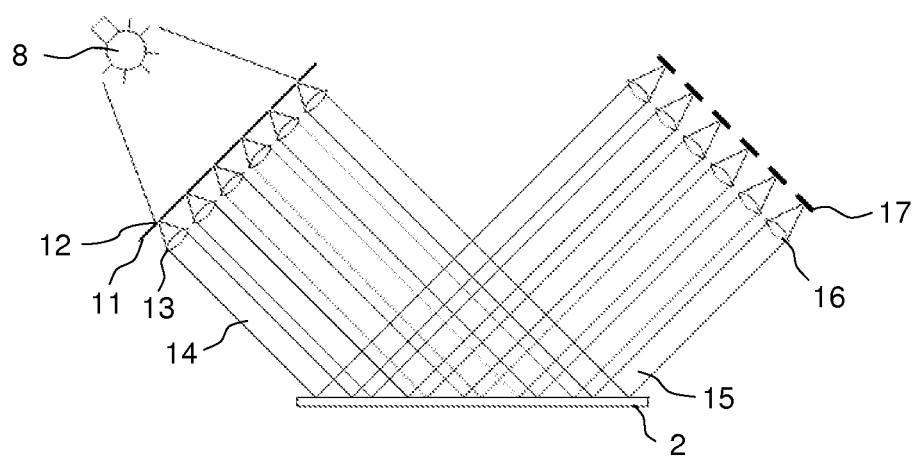
FIG. 5 shows a first embodiment of a measuring arrangement.

FIG. 5 shows a first embodiment of the second measuring instrument including the auxiliary light source 8. The light source 8 directs measurement light ML onto a perforated plate 11. A plurality of point light sources 12 are generated by the illuminated perforated plate 11. Converging lenses 13 suitably provided downstream in the form of a microlens array constitute a collimator and produce a multiplicity of parallel collimated beams 14. Each beam 14 is directed onto a single micromirror 2 of the arrangement 3.

The collimated beams 14 then propagate, now as reflected beams 15, towards a microlens array including a plurality of converging lenses 16 which produce in their rear focal plane a Fourier transform (far-field diffraction pattern) of the angular distribution of the reflected beams 15. If a position sensor 17 is arranged in the rear focal plane of the lenses 16, an angle change of the incidence direction of the reflected rays 15 translates into a deviation of the focal spot from a neutral position, which can be detected by the position sensor. For example, 4-quadrant detectors or two-dimensional position-sensitive sensors may be used as position sensors. In this way, for example, an angle range of ±2 to 3° can be determined for a tilt relative to a predetermined surface alignment.

Figure 6:
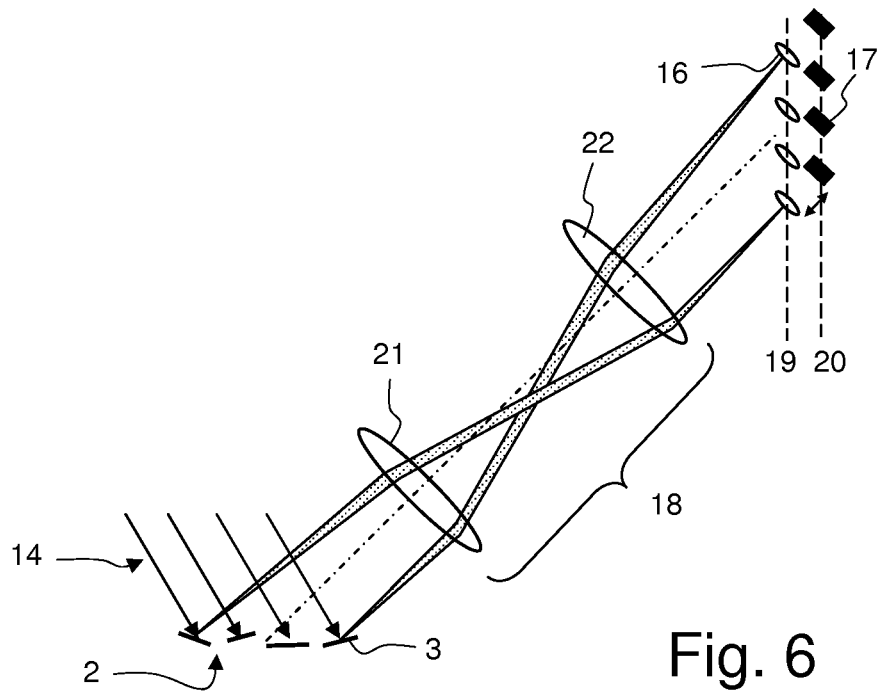
FIG. 6 shows a second embodiment of a measuring arrangement.

In order to be able to arrange the second detector instrument 7 with the position sensors 17 and the upstream optical system with the microlens array 16 at some distance away from the multi-mirror arrangement 2, according to another embodiment, which is illustrated in FIG. 6, additional relay optics 18 are provided which are represented purely schematically by two converging lenses 21 and 22. The position sensors 17 and the microlens array 16 are furthermore arranged in planes 19 and 20, respectively, which satisfy the Scheimpflug condition with respect to the multi-mirror arrangement 2 to be measured and the optical relay optics 18 being used. It is therefore possible to image the plurality of micromirrors 3 equally sharply onto the lenses 16 of the microlens array. The relay optics 18 allow a larger distance from the multi-mirror arrangement 2, without restricting the angle range to be measured. In this way the measurement device can be arranged outside the beam path, where sufficient installation space is available. Owing to the relay optics 18, the detectable tilt angle range is not dependent on the distance of the sensors 17 from the multi-mirror arrangement 2. Furthermore, satisfying the Scheimpflug conditions allows a corresponding angled arrangement of the second detector instrument 7.

Similarly as in the embodiment of FIG. 5, the position or the centroid of the light cone striking the position sensor 17 changes as a function of the angle of incidence, with which the beams impinge on the upstream lens 16. Owing to the imaging by the relay optics 18, however, this is in turn proportional to the tilt angle of the associated mirror element 3. Through measuring, with the help of the position sensor 17, deviations from a neutral position which correspond to known orientations of the micromirrors 3, it is again possible to determine the tilt angle of the micromirrors 3.

Figure 7:
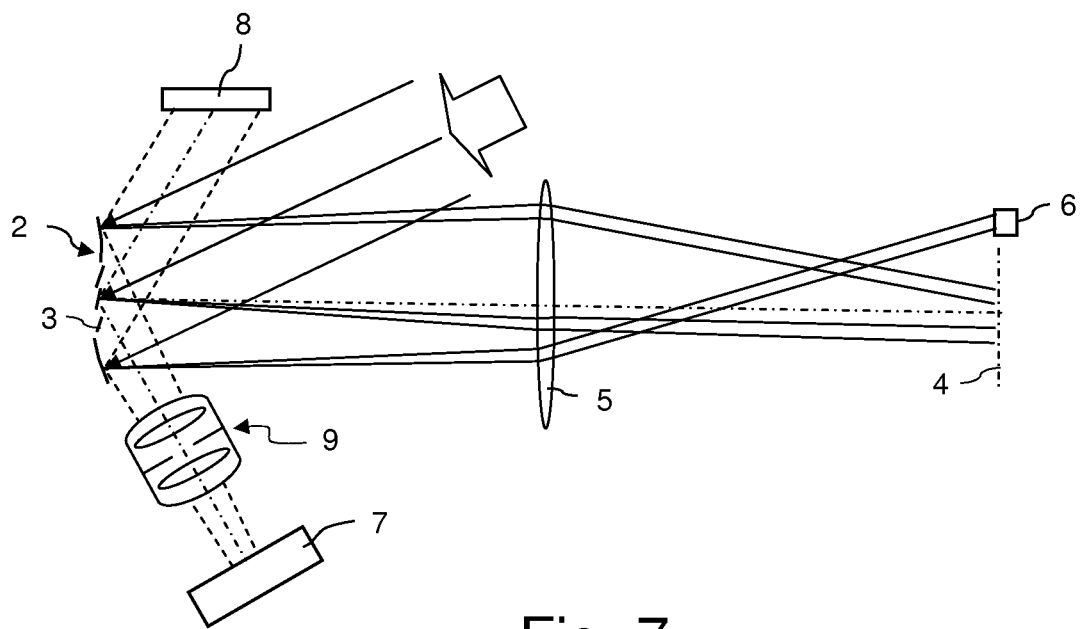
FIG. 7 shows a third embodiment of a measuring arrangement in a part of illumination optics.

FIG. 7 shows another embodiment, as is provided in an optical arrangement according to FIG. 1, of a measuring arrangement with separate auxiliary light. Correspondingly, identical components are provided with the same references and will not be described again below.

In the embodiment of FIG. 7, the optics 9 between the multi-mirror arrangement 2 and the second detector instrument 7 are formed by telecentric imaging optics. An angle-resolving sensor is provided in the second detector instrument 7 in order to determine the corresponding positions or alignments of the micromirrors 3 from the measurement of auxiliary light reflected by the multi-mirror arrangement 2 from the auxiliary light source 8.

Figure 8:
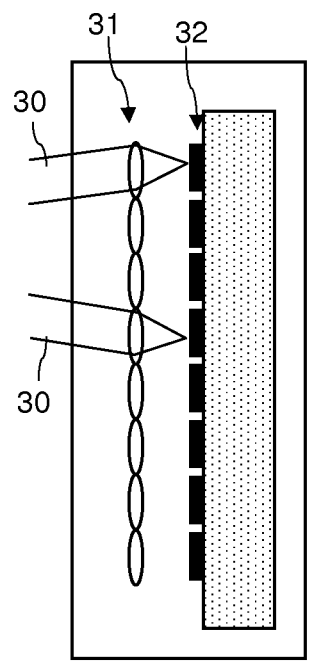
FIG. 8 shows a representation of an angle-resolving detector.

A suitable angle-resolving sensor is shown in FIG. 8. The angle-resolving detector of FIG. 8 is constructed from a lens array 31, i.e. a multiplicity of converging lenses, which are assigned to a position array 32 including a multiplicity of position sensors. Ray bundles 30 which are directed at different angles onto the sensor of FIG. 8, owing to the different alignments of the micromirrors 3 of the multi-mirror arrangement 2, are focused by the converging lenses of the lens array 31 onto different positions of the position sensors of the position sensor array 32, so that the alignment of the micromirrors 3 in the multi-mirror arrangement can be determined.

Figure 9:
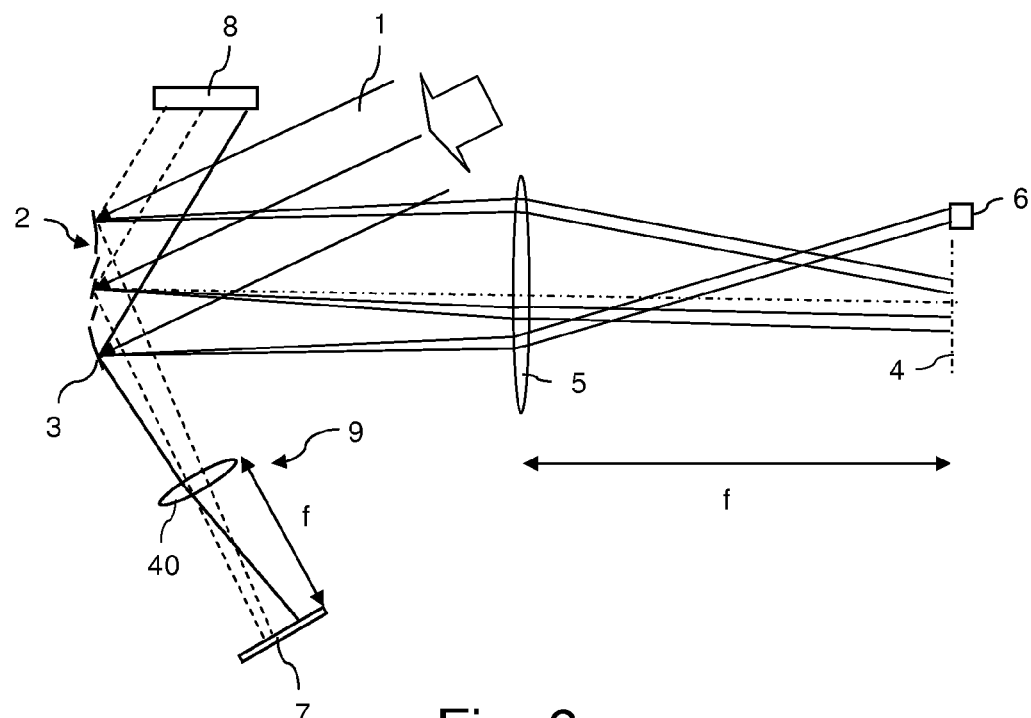
FIG. 9 shows a representation of a fourth embodiment of a measuring arrangement in a part of illumination optics.

Another embodiment of the separate measuring arrangement with auxiliary light in an optical arrangement according to FIG. 1 is represented in FIG. 9. Here again, identical components are provided with the same references so that repeated description of these components is superfluous.

In the embodiment of FIG. 9, the optics 9 are formed by a measurement lens 40 having a focal plane in which is a position-sensitive sensor serving as the second detector instrument 7 is arranged. Owing to this arrangement, the position on the position-sensitive sensor corresponds to the alignment or tilt of the micromirror 3 which is reflecting auxiliary light from the auxiliary light source 8 onto the second detector instrument 7.

The correlation between the first and the second measurement system can be carried out directly if the auxiliary light source 8 is designed as a light source array having a multiplicity of light sources arranged next to one another, wherein each light source of the light source array 8 produces a measurement light bundle for a single micromirror or a group of several micromirrors 3 of the multi-mirror arrangement 2. Each light bundles directed towards the micromirrors is reflected towards the second detector instrument 7.

Although each light source is assigned to one micromirror 3, the angle positions of the individual micromirrors 3 are determined successively. In this case, the micromirror 3 to be measured can be set so that it simultaneously reflects the primary light 1 into the first detector instrument 6, while the alignment of the micromirror 3 is being measured with the help of the secondary light detected by the second detector instrument 7. In contrast, in the embodiment of FIG. 7, for example, the multi-mirror arrangement 2 is completely illuminated by the auxiliary light source 8 so that all the micromirrors 3 of the multi-mirror arrangement 2 are measured and monitored.

Figure 10:
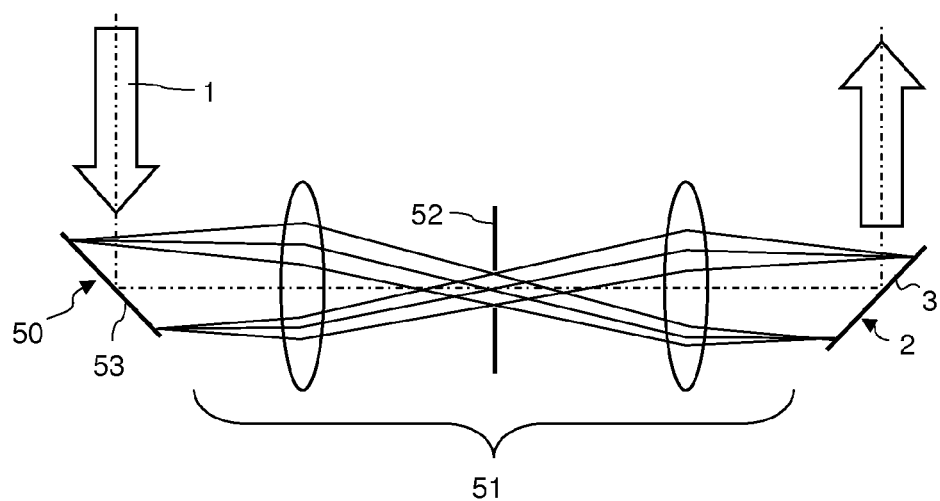
FIG. 10 shows a further part of illumination optics in a first functional setting.

FIG. 10 shows an embodiment of an optical arrangement which may likewise be used for illumination optics as represented in parts in FIGS. 1, 7 and 9.

In FIG. 10, the multi-mirror arrangement 2 as represented in FIGS. 1, 7 and 9 is preceded by a second multi-mirror arrangement 50 which receives the primary light 1 from the light source.

The second multi-mirror arrangement 50 is arranged so that it is imaged onto the first multi-mirror arrangement 2 via relay optics 51 which ensures true-position and true-angle imaging.

The second multi-mirror arrangement 50 is arranged in the beam path so that, with a so-called neutral setting of the mirror elements, the second multi-mirror arrangement 50 acts as a simple plane folding mirror.

The mirror elements of the second multi-mirror arrangement 50 can likewise be swivelled at least about a single axis, so that the mirror elements can be moved out of their neutral setting. In this case, the primary light 1 is reflected so that it is blocked by a diaphragm 52 of the optics 51. Correspondingly, it is merely desirable for the second multi-mirror arrangement to be switchable between a neutral setting, in which the reflected primary light is directed by the optics 51 onto a corresponding micromirror 2 of the first multi-mirror arrangement 3, and a second setting in which the reflected primary light is blocked by the diaphragm 52. Consequently, it is sufficient to provide a multi-mirror arrangement which provides merely one tilt axis for the mirror elements.

The arrangement having two multi-mirror arrangements may be employed by using the second multi-mirror arrangement to ensure that no light of the primary light 1 can any longer be directed onto a micromirror 3 of the first multi-mirror arrangement 2, when the relevant micromirror 3 is defective. With a multiplicity of micromirrors in a multi-mirror arrangement, the likelihood is very high that individual mirrors will fail and therefore no longer be controllable. The light reflected by such a defective micromirror into the illumination optics of a projection exposure apparatus is detrimental for the microlithography, however. The arrangement shown in FIG. 10 makes it possible to switch defective micromirrors on and off straightforwardly by the second multi-mirror arrangement 50 upstream.

Figure 11:
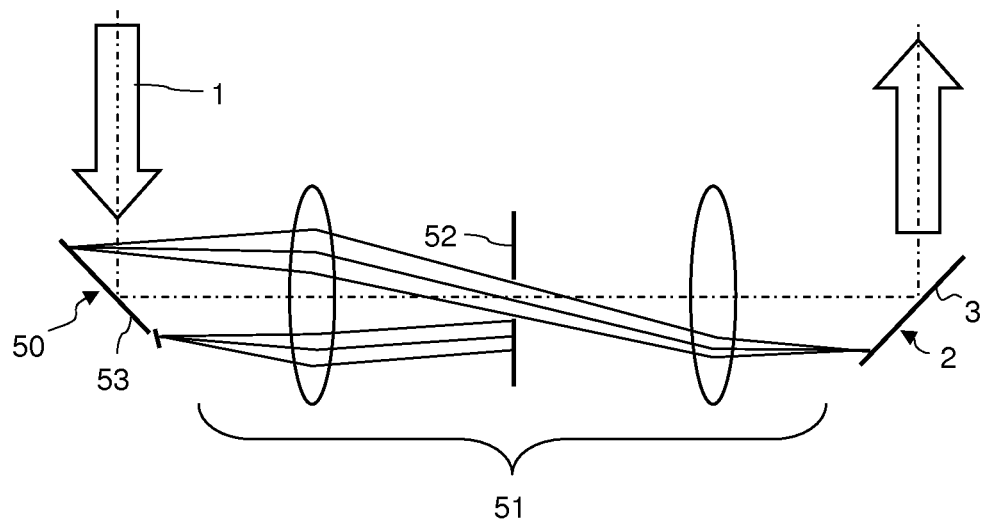
FIG. 11 shows the illumination optics part of FIG. 10 in a second functional setting.

This is illustrated in FIG. 11, in which a single micromirror 53 of the multi-mirror arrangement 50 is brought into a position in which no light is directed onto the corresponding micromirror 3 of the multi-mirror arrangement 2. Rather, the micromirror or the mirror element 53 in FIG. 11 is in a position in which the reflected light is blocked by the diaphragm 52.

Figure 12:
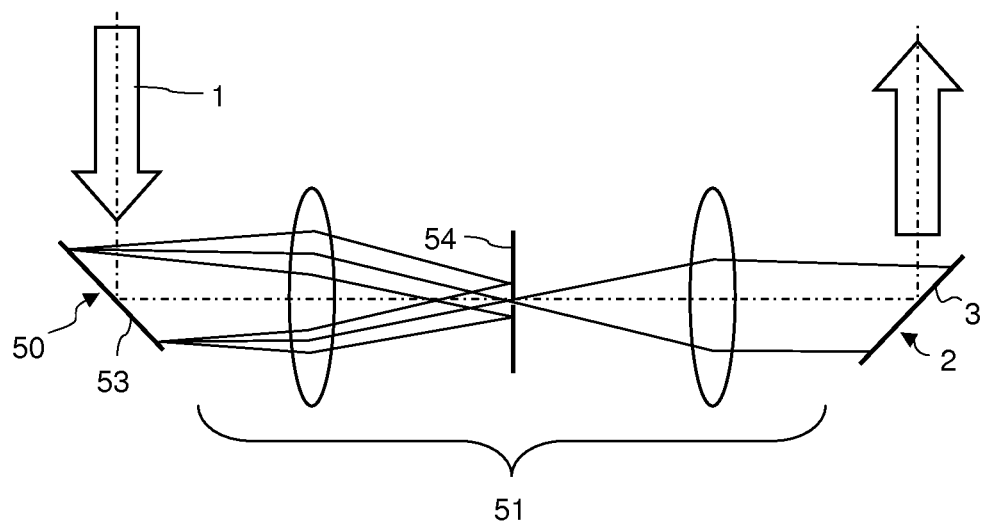
FIG. 12 shows another embodiment of a part of illumination optics.

FIG. 12 shows an embodiment of an optical arrangement which corresponds essentially to the optical arrangement shown in FIGS. 10 and 11, so that identical components are here again provided with the same references. A corresponding description of known components is therefore superfluous.

The embodiment of FIG. 12 differs from the embodiments of FIGS. 10 and 11 in that the diaphragm 52 includes an adjustable diaphragm aperture (i.e. an iris diaphragm). The effect of the iris diaphragm 54, by changing its aperture diameter, is to reduce the angle range from which light strikes the first multi-mirror arrangement 2. The diameters of the light spots of the micromirrors 3 of the first multi-mirror arrangement 2 are therefore reduced. This is advantageous particularly for pupil illumination in which only a small region of the overall pupil is intended to be illuminated.

The described optical arrangement with two multi-mirror arrangements may advantageously be combined with the monitoring devices described above, so that when failure of a micromirror is established, the corresponding illumination of this micromirror can be switched off by the second multi-mirror arrangement 50 upstream. This may for example be carried out automatically by a corresponding control instrument, which controls both the monitoring system and the second multi-mirror arrangement 50.

Figure 13:
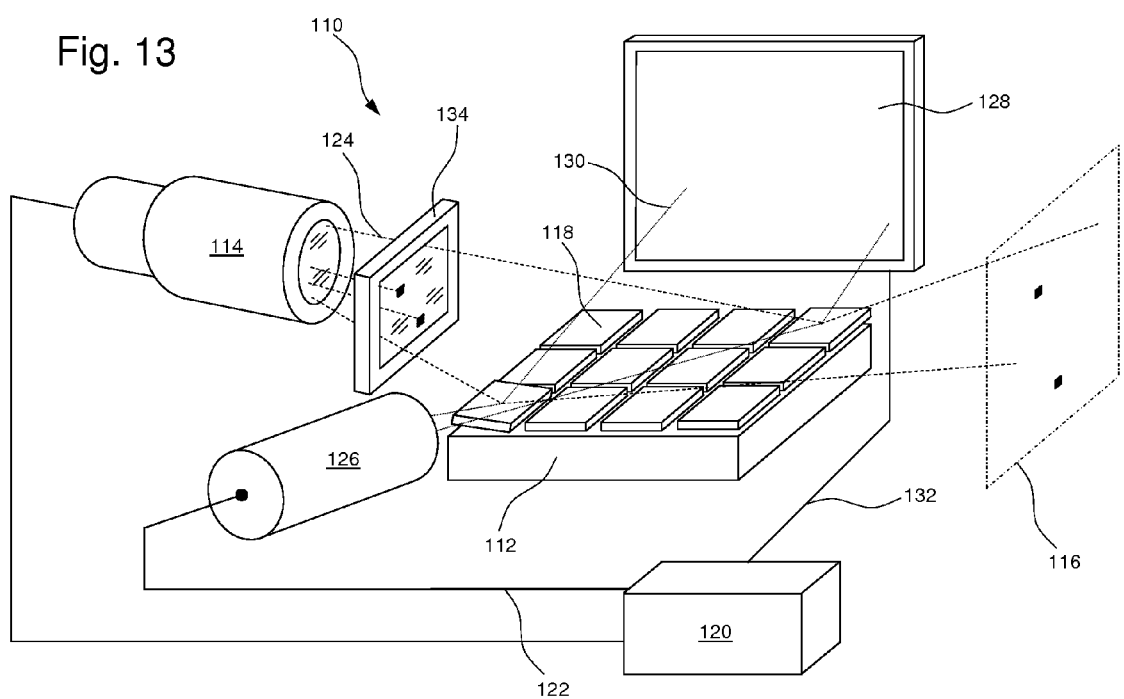
FIG. 13 shows another embodiment of a multi-mirror arrangement for illumination optics, having an attenuation instrument arranged between a light source and a multi-mirror arrangement.

Another embodiment of illumination optics 110 represented in FIG. 13 for a projection exposure apparatus (not represented in detail) includes a multi-mirror arrangement 112, which is arranged in an optical path between a light source 114 and a pupil surface 116 represented schematically as a plane. The multi-mirror arrangement 112 includes a plurality of micromirrors 118 which can be tilted independently of one another, each of which is assigned a piezoelectric drive instrument (not represented) for inducing the respective tilt movement. The drive instruments are driven by applying control signals, which are generated by a control unit 120 and transmitted via control lines 122. The micromirrors 118 can be tilted about two tilt axes respectively aligned parallel to the largest body edges of the multi-mirror arrangement. The tiltable micromirrors 118 allow deliberate deviation of the light rays provided by the light source 114. To each micromirror 118 a portion of the light rays 124 emerging from the light source 114 are assigned, so that the individual micromirror 118 can deviate the respectively associated portion of light rays 124 (represented schematically) according to its spatial alignment.

In addition to the light source 114, the illumination optics 110 are assigned a measurement light source 128 which is essentially aligned orthogonally to the light source 114 and emits measurement light rays 130 onto the micromirrors 118. The measurement light rays 130 (also represented only schematically) like the light rays 124 are reflected by the reflective layers (not represented in detail) of the micromirrors 118 in the direction of a detector array 128. The measurement light rays 130 strike the detector array 128 as a function of the spatial alignment of the micromirrors 118 and, in uniquely assignable detector cells (not represented in detail), they generate a signal which can be provided via the signal line 132 to the control instrument. With the aid of the detector array 128 it is therefore possible to determine discrepancies between the actual and the desired spatial alignment of the micromirrors 118. It is possible to deduce therefrom whether one or more micromirrors 118 are possibly not aligned correctly. For evaluating a malfunction of a micromirror 118, at least one threshold value is stored in the control unit 120, by which the actually existing discrepancy of the spatial alignment of the respective micromirror 118 can be determined. If the predetermined threshold value is exceeded, then countermeasures may be instigated with the aid of the control unit in order to avoid an unintended intensity distribution of the light rays 124 in the pupil surface.

In the embodiment according to FIG. 13, a switchable diaphragm instrument 134 is arranged in the optical paths of the light rays 124 between the light source 114 and the multi-mirror arrangement 112. The diaphragm instrument 134 includes two cover plates (not represented in detail) between which a matrix arrangement (not represented in detail) of liquid crystal-filled regions, which are electrically driveable, are arranged. By applying an electrical voltage to the liquid crystal-filled regions, their transmission for the light rays 124 can be altered. Individual regions of the diaphragm instrument 134 may therefore be driven by the control unit so that they transmit the incident light 124 at least virtually unimpeded; other regions of the diaphragm instrument 134, on the other hand, may be driven by the control unit 120 so that the incident light 124 is blocked, as indicated in FIG. 13 by the two blackened regions of the diaphragm instrument 134. The diaphragm instrument 134 therefore allows deliberately blocking of individual light paths, so that those light rays 124 which are assigned to defective micromirrors 118 cannot reach the micromirrors 118 at all. This prevents these light rays 124 from striking the pupil surface possibly in an undesired way by coming from defective micromirrors 118. In this embodiment, it is sufficient for the number of driveable liquid crystal-filled regions of the diaphragm instrument to correspond at least approximately to the number of micromirrors 118.

Figure 14:
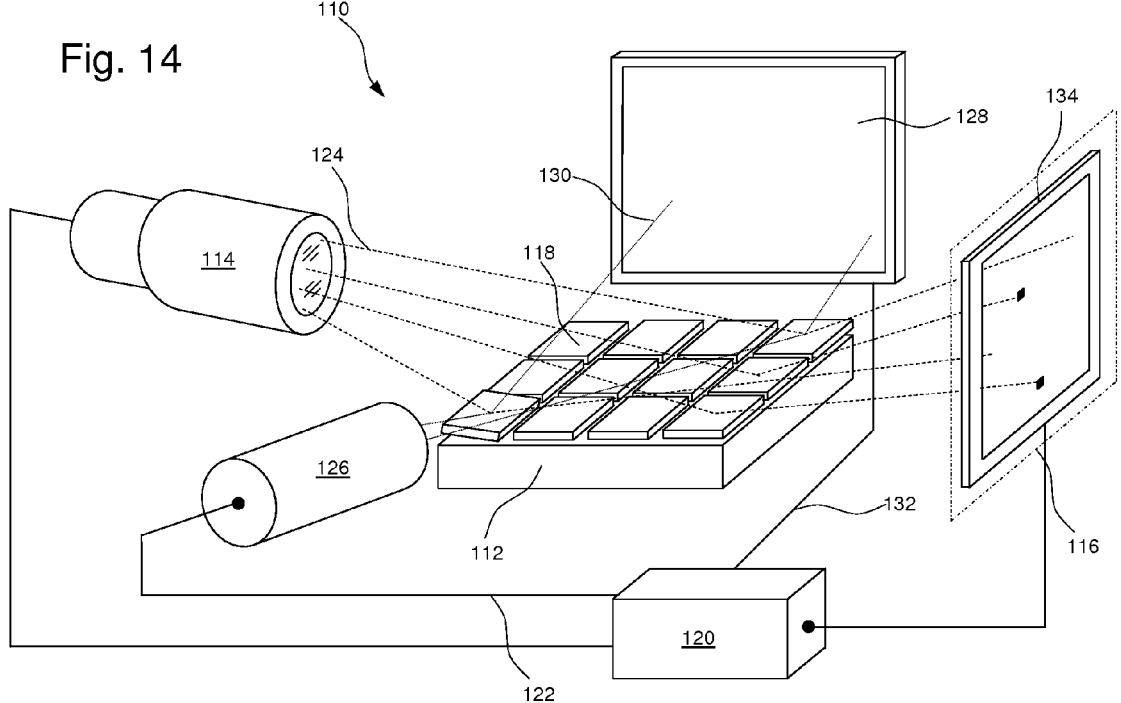
FIG. 14 shows another embodiment of a multi-mirror arrangement for illumination optics, having an attenuation instrument arranged between a multi-mirror arrangement and a pupil surface.

The embodiment according to FIG. 14 includes essentially the same modules as the embodiment according to FIG. 13. Functionally equivalent modules are denoted by the same reference numerals as in FIG. 13. In contrast to the embodiment according to FIG. 13, the diaphragm instrument 134 is arranged immediately in front of the pupil surface. The light rays 124 provided by the light source 113 can therefore strike the micromirrors 118 unimpeded, and are reflected there. Only immediately in the region of the pupil plane 116 (in front, in or behind) a choice is made between correctly arriving light rays and misguided light rays. In this embodiment, it is advantageous for the number of driveable liquid crystal-filled regions of the diaphragm instrument to exceed the number of micromirrors 118 by a multiple, so that the light intensity on the pupil surface 116 can be adjusted as exactly as possible according to the specifications.

Figure 15:
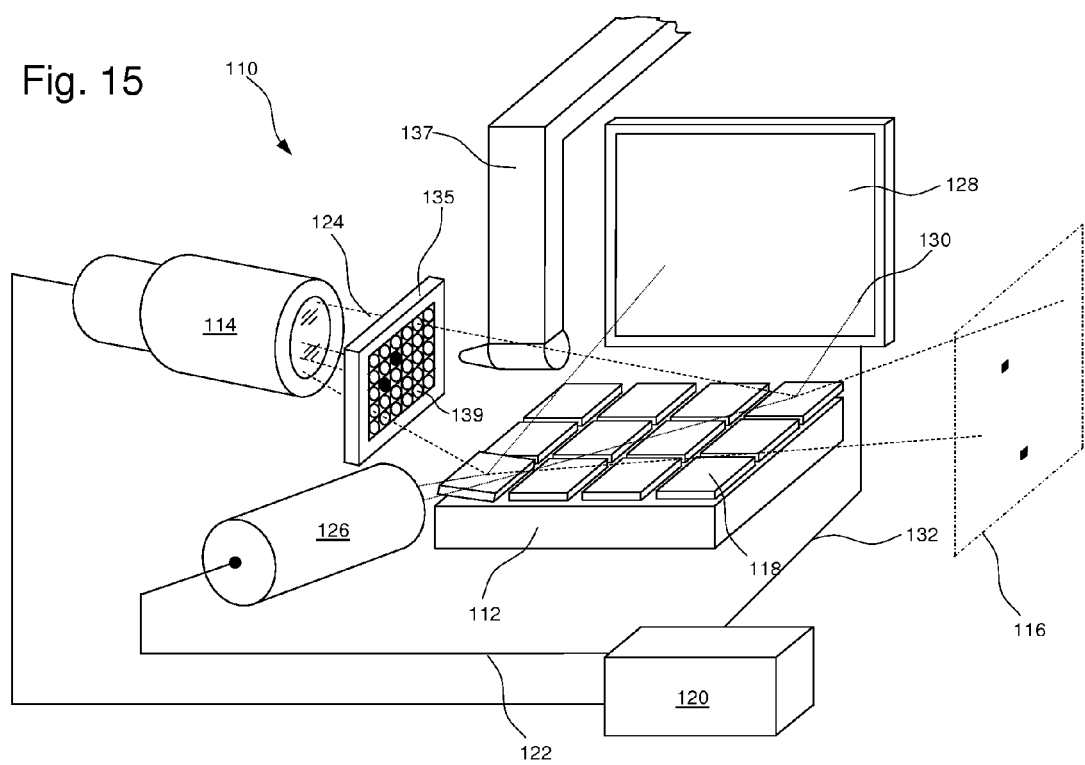
FIG. 15 shows another embodiment of a multi-mirror arrangement for illumination optics, having a microlens arrangement arranged between a light source and a multi-mirror arrangement.

The embodiment according to FIG. 15 includes essentially the same modules as the embodiments according to FIGS. 13 and 14, and is provided with the same reference numerals where modules are functionally equivalent. In contrast to the embodiments according to FIGS. 13 and 14, in the embodiment according to FIG. 15 a microlens arrangement 135, through which the light rays 124 provided by the light source 114 pass, is provided between the light source 114 and the multi-mirror arrangement 112. If the spatial alignment of a micromirror 118 cannot be carried out correctly in a light path between the light source 114 and the pupil surface 116, a manipulator 137 translatable into the optical beam path is used to provide the respectively associated microlens 139 in the microlens arrangement 135 with a light-absorbent coating, so that the corresponding light rays 124 cannot strike the defective micromirror 118.

Figure 16:
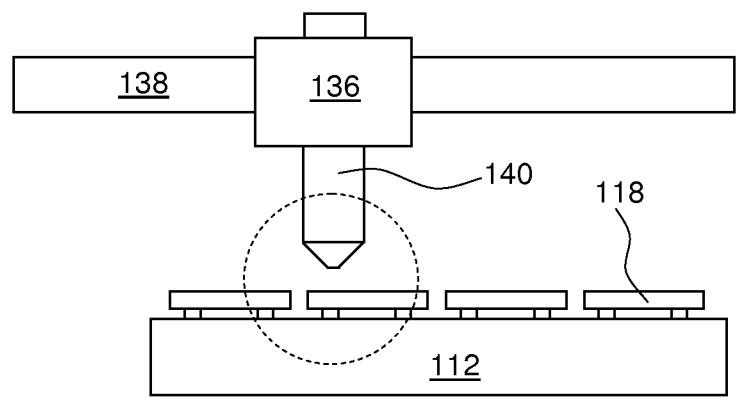
FIG. 16 shows a schematic representation of a manipulator, which is assigned to the multi-mirror arrangement and carries an applicator.

In the embodiment according to FIG. 16 a manipulator 136, which is held displaceably by a guide instrument 138 and carries an applicator 140, is assigned to the multi-mirror arrangement 112. The guide instrument 138 makes it possible to displace the manipulator in a plane which is aligned at least essentially parallel to a surface of the micromirror 118 represented in a neutral setting. The applicator 140 is used to affect defective micromirrors 118 so that only some light rays 124 which strike these micromirrors 118, or optionally none of them, can reach the pupil surface. Some embodiments of a suitable applicator 140 will be described below with reference to FIGS. 16 to 21.

Figure 17:
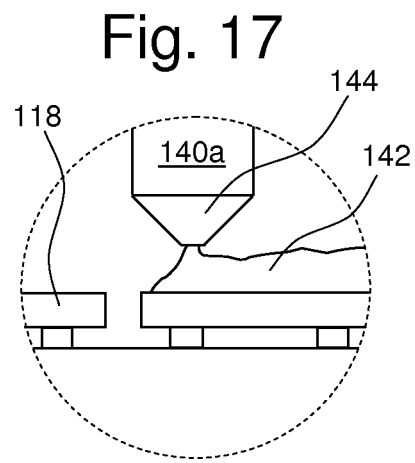
FIG. 17 shows a detailed representation of an embodiment in which the applicator is designed as an application instrument for a light-absorbing or optically transparent shapeless compound.

The applicator 140*a* according to FIG. 17 is designed as an application instrument for applying a light-absorbing or optically transparent shapeless compound onto the micromirrors. To this end the applicator 140*a* includes an integrated dosing instrument (not represented) with the aid of which a shapeless, optionally viscous compound 142 can be applied from a storage container (not represented) arranged in the applicator 140*a* through a conical nozzle 144 onto the surface of a defective micromirror 118. The shapeless compound 142 may be a light-absorbing compound, which at least predominantly absorbs the light rays directed onto the micromirror 118 and therefore prevents these light rays from striking the pupil surface. When an optically transparent compound is applied onto the micromirror 118, its (irregular) surface forms an additional refractive surface that, as a result of the oblique incidence, strongly deflects the light passing this surface. The effect achievable by this is similar to scattering so that the twice refracted light does not reach the pupil surface 116. The advantage of scattering the light rays 124 directed onto the micromirror 118 is that at most slight heating of the micromirror 118 and possibly neighboring micromirrors 118 due to the scattered light takes place. Absorption of the light rays 124 in a corresponding absorption layer, conversely, may lead to possibly detrimental heating of the micromirror 118 and neighboring micromirrors 118. The shapeless compound 142 may be selected so that it is cured by the incident light rays. With respect to its viscosity, the shapeless compound 142 may be selected so that it can be prevented from flowing off the surface of the micromirrors 118 provided with it, without curing having to take place.

Figure 18:
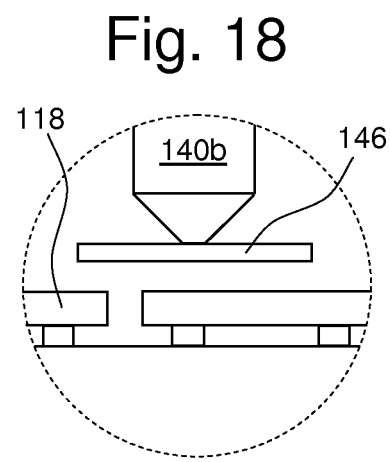
FIG. 18 shows a detailed representation of an embodiment in which the applicator is designed as an application instrument for a reflecting or absorbing optical element.

In the embodiment according to FIG. 18, the applicator 140*b* is designed as an application instrument for a reflecting or absorbing optical element 146. Suitable elements 146 are kept in a store (not represented in detail) positioned away from the multi-mirror arrangement 112 and if need be are taken with the aid of the manipulator and the applicator 140*b* fitted thereon, in particular by suction using a negative pressure instrument (not represented in detail), and put onto a defective micromirror 118. The element 146 may be a section of a light-absorbing film or a section of an at least locally reflective film. The respective film section may be designed so that it sticks owing to adhesion on the surface of the micromirror 118. Respective films may be wedge-shaped so that light is reflected away from the pupil surface.

Figure 19:
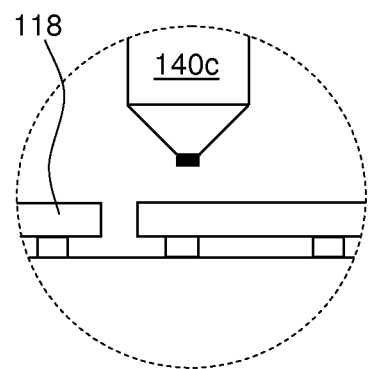
FIG. 19 shows a detailed representation of an embodiment in which the applicator is designed as printing pad for a light-absorbing layer.

In the embodiment according to FIG. 19, the applicator 140*c* is designed with a printing pad in order to form a light-absorbing layer on the surface of the micromirror 118. The frustoconical region of the applicator 140*c* is made of a resilient material and is adapted on the end face next to the micromirror 118 to receive a dye kept in a store away from the multi-mirror arrangement. Upon contact with the micromirror 118, the dye can be released onto its surface so as to reduce the reflectivity of the micromirror 118.

Figure 20:
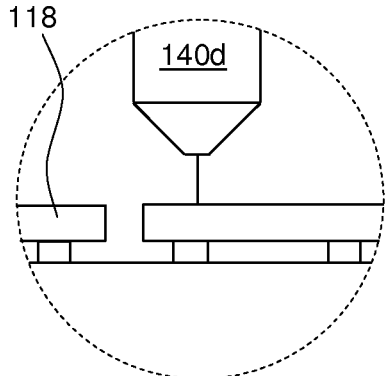
FIG. 20 shows a detailed representation of an embodiment in which the applicator is designed as a light source.

In the embodiment according to FIG. 20, the applicator 140*d* is designed as a light source, in particular as a laser light source. With the aid of the light delivered onto the defective micromirror 118 by the applicator 140*d*, the optical properties of the micromirror 118 can be modified by thermal or chemical action. For example, the micromirror 118 may be heated by irradiation with light of a suitable wavelength so that the reflecting layer of the micromirror 118 evaporates or loses its reflectivity due to chemical processes induced by the strong laser light.

Figure 21:
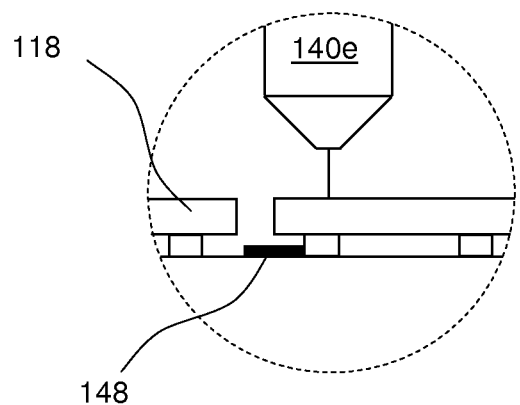
FIG. 21 shows a detailed representation of an embodiment in which the applicator is designed as an energy source to provide an activation energy.

In the embodiment according to FIG. 21, the applicator 140*e* is designed as an energy source for providing an activation energy. With the aid of the activation energy, a material volume 148 arranged below the defective micromirror 118 can be activated. The material volume 148 may be selected so that it expands irreversibly in response to the activation energy, and therefore deflects the micromirror 118 into a setting in which deviation of the incident light rays onto the pupil surface can be prevented.

Figure 22:
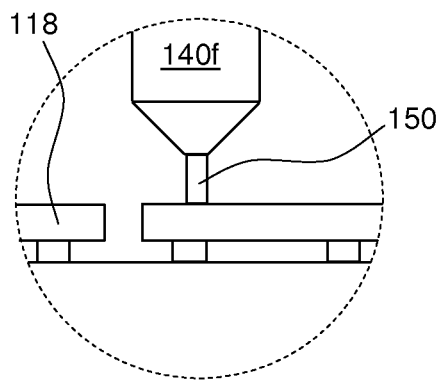
FIG. 22 shows a detailed representation of an embodiment in which the applicator is designed as an actuator for exerting force on the beam deviating element.

In the embodiment according to FIG. 22, the applicator 140*f* includes an actuator (not represented in detail) for exerting a force onto the defective micromirror 118. With the aid of the actuator designed as a linear drive, a plunger 150 exerts a force directed downwards in the vertical direction according to the representation in FIG. 22 onto the micromirror 118, and thereby deforms the drive instrument of the micromirror 118 irreversibly. The micromirror 118 is therefore tilted into a setting in which it can no longer direct the incident light rays onto the pupil surface 116.

Figure 23:
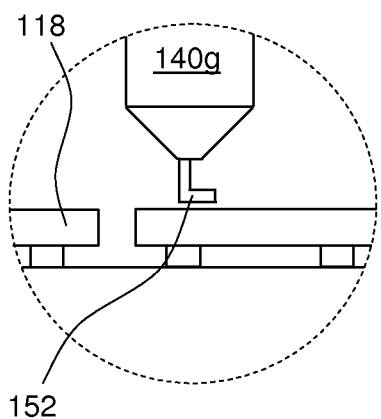
FIG. 23 shows a detailed representation of an embodiment in which the applicator is designed as a gripping instrument for removing beam deviating elements.

In the embodiment according to FIG. 23, the applicator 140*g* includes an adjustable gripper 152 which allows peripheral engagement of a micromirror 118 in order to remove it from the multi-mirror arrangement 112. A mechanical connection between the micromirror 118 and the associated drive instrument can be configured so that the micromirror 118 can be lifted off without thereby releasing particles, which could possibly accumulate on neighbouring intact micromirrors 118. This may in particular be achieved by selecting a suitable adhesive bond.

Figure 24:
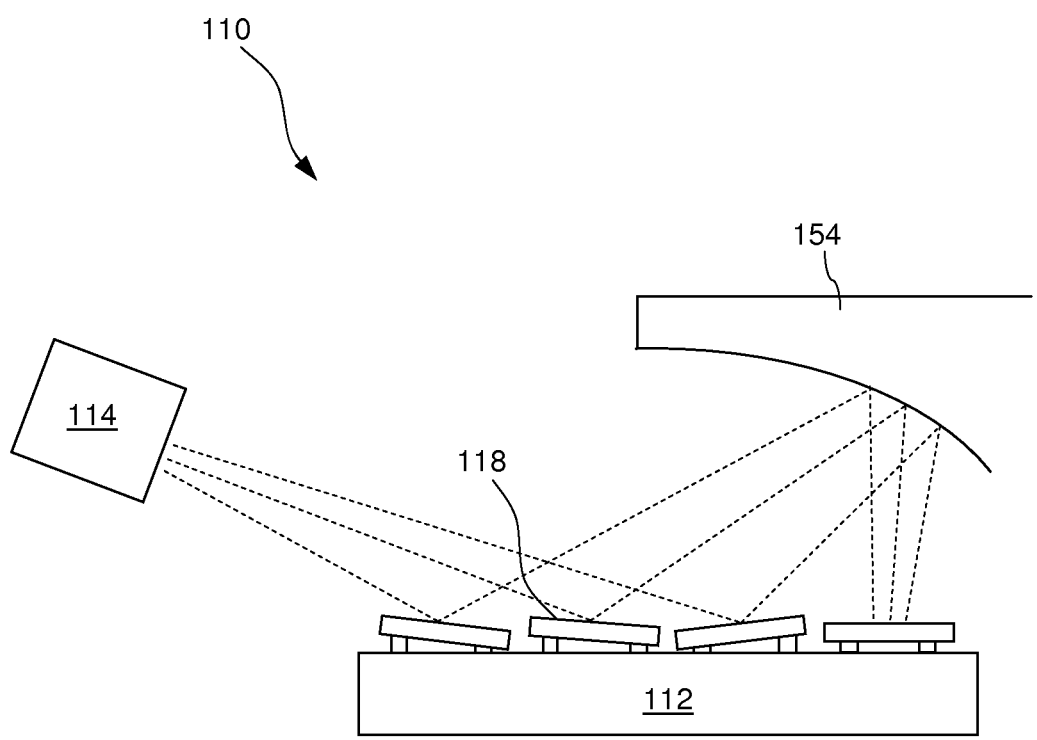
FIG. 24 shows a schematic representation of a mirror instrument arranged movably relative to the beam deviating elements.

In the embodiment according to FIG. 24, a mirror instrument 154 is provided which can be moved relative to the multi-mirror arrangement 112. With the aid of this mirror instrument 154, the light rays 124 striking intact, correctly drivable micromirrors 118 can be deviated onto a defective micromirror 118 so that it is destroyed mechanically and/or optically and/or chemically by the heating effect which occurs. To this end, the mirror instrument 154 may be brought from an idle position away from the multi-mirror arrangement 112 into a functional position represented in FIG. 23, in which the intact micromirrors 118 are deflected correspondingly.

In the following an embodiment is described with reference to FIGS. 25 and 26 which may be regarded as a kind of generalization of the embodiments described above with reference to FIGS. 10 to 24.

Figure 25:
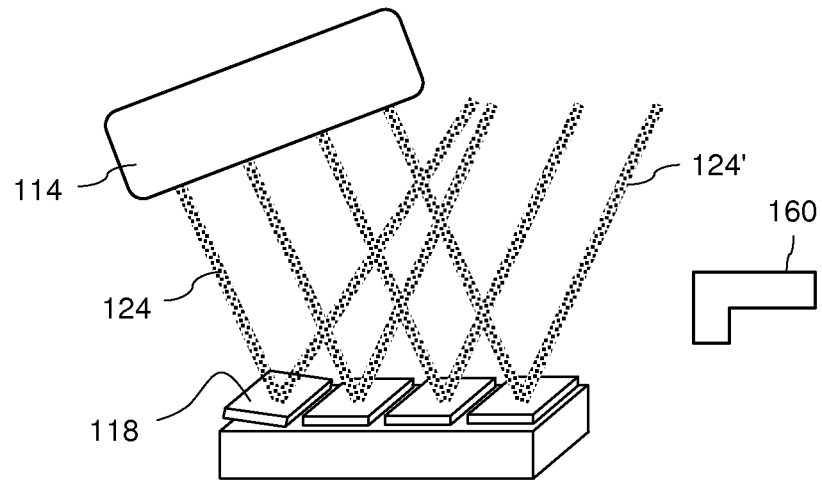
FIG. 25 is a perspective view of a 4×1 matrix arrangement of four micromirrors.
Figure 26:
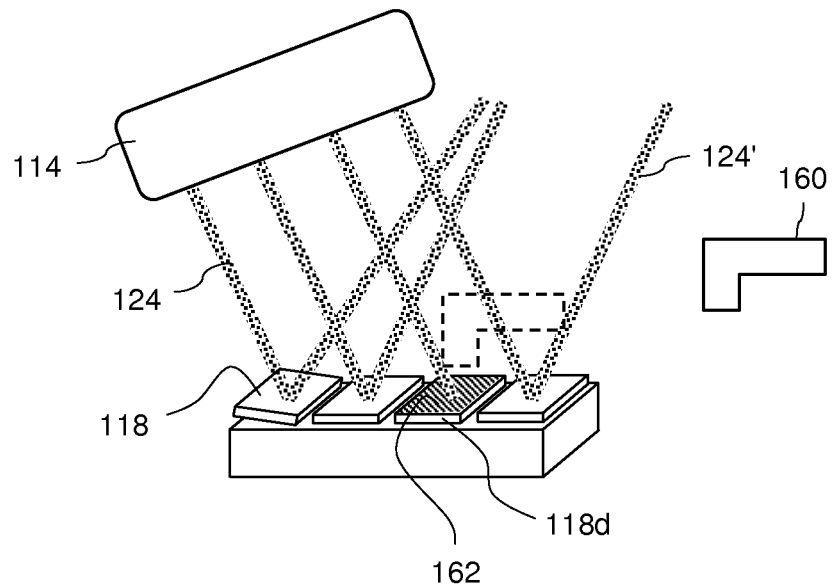
FIG. 26 is a perspective view of the matrix arrangement shown in FIG. 25, but with one of the mircomirrors disabled.

FIG. 25 is a perspective schematic view of a 4×1 matrix arrangement 112 of N=4 micromirrors 118. In other embodiments the matrix arrangement includes more than one column and more than one line of micromirrors 118. Each micromirror 118 can be tilted upon application of a suitable control signal. A first optical system 114 produces N individual input light beams 124. In the embodiment shown it is assumed that the input light beams 124 are collimated. In other embodiments the input light beams 124 diverge or converge. The first optical system 114 directs the input light beams 124 towards the micromirrors 118 such that on each micromirror 118 one input light beam 124 impinges. Thus there is a one to one correspondence between the input light beams 124 on the one hand and the micromirrors 118 on the other hand. The input light beams 124 can have, when impinging on the micromirrors 118, a cross-section that is smaller than the reflecting surface of the micromirrors 118. If none of the micromirrors are defective, i.e. all micromirrors 118 are capable of reflecting the input light beam 124 impinging thereon, the number of output light beams 124' equals the number N of input light beams 124.

A beam extinction unit 160 is provided that is capable to reduce the number N of output light beams 124' by k, with $1 \leq k \leq N$. In the embodiment shown the beam extinction unit 160 is configured to reduce the number of output light beams by (optionally irreversibly) disabling 1 of the micromirrors 118. Here it is assumed that this is accomplished by applying an absorbing layer 162 on the reflective surface of a micromirror 118d that shall be disabled. This process is indicated in FIG. 26 by the representation of the beam extinction unit 160 in dashed lines. As a matter of course, any of the other ways that have been explained above with reference to FIGS. 16 to 23 may be used additionally or instead. For example, the extinction unit 160 may be constructed such that it reduces the reflectivity of a reflection coating of a micromirror. This may be accomplished by destroying the coating by high intensity electromagnetic radiation. To this end intact micromirrors may reflect light rays towards an additional mirror which redirect the light rays towards the defective micromirror, as has been explained above with reference to FIG. 24. Alternatively or additionally the high intensity electromagnetic radiation may be generated by an additional light source, such as laser light source. As a result of disabling one of the micromirrors 118, the number of output light beams 124' is reduced by 1 also.

In other embodiments the beam extinction unit is configured to reduce the number of output light beams by reducing the number of input light beams that impinge on the arrangement of beam deviating elements. This may be achieved by blocking light beams with the aid of a diaphragm, for example an LCD panel, on their way between the first optical system 114 and the arrangement of micromirrors 118. Alternative or in additionally the beam extinction unit 160 may include a second multi-mirror arrangement 50, as has been described above with reference to FIGS. 10 to 12.

In so far as micromirrors are referred to in the present application, this is intended to mean all mirror elements irrespective of any particular size. The term derives from the size ratios conventionally existing for multi-mirror arrangements having a few hundred to a few million mirror elements.

In so far as the term light is used in the present application, this is intended to mean any electromagnetic radiation which may be used for the methods and devices.

The above description of embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof

The invention claimed is:

1. An illumination system having a beam path between a light source and a pupil surface, the illumination system comprising:
an arrangement of individually drivable beam deviating elements arranged at a first location along the beam path, each beam deviating element being configured to direct light impinging thereon onto different positions on the pupil surface in response to a control signal applied to the beam deviating element; and
an attenuation unit arranged at a second location along the beam path, the attenuation unit being configured so that, during use of the illumination system, the attenuation unit selectively reduces an intensity of light, which is directed by at least one but not all arbitrary beam deviating element onto the pupil surface, by more than 50%, wherein:
the first location is different from the second location;
the attenuation unit is configured to reduce the intensity of light before the light strikes any of the beam deviating elements; and
the illumination system is configured to be used in a microlithographic projection exposure apparatus.

2. The illumination system according to claim 1, wherein the attenuation unit is configured so that, during use, it reduces the intensity of light, which is directed by any arbitrary beam deviating element onto the pupil surface, by more than 75%.

3. The illumination system according to claim 1, wherein the attenuation unit comprises a further arrangement of individually drivable beam deviating elements and imaging optics, which optically conjugate the two arrangements of beam deviating elements with one another.

4. The illumination system according to claim 3, wherein the beam deviating elements of the further arrangement can be switched so that light striking a beam deviating element of the further arrangement either strikes a beam deviating element, associated by the optical conjugation, in the other arrangement or does not strike the other arrangement at all.

5. The illumination system according to claim 1, wherein the attenuation unit comprises a diaphragm unit which is configured to exclusively block light striking any of the beam deviating elements.

6. The illumination system according to claim 5, wherein the diaphragm unit comprises a diaphragm and a diaphragm holder which is configured to receive the diaphragm.

7. The illumination system according to claim 5, wherein the diaphragm unit comprises a switchable diaphragm which is arranged permanently in the beam path and has a transmissivity which can be varied locally by applying a control signal.

8. The illumination system according to claim 7, wherein the switchable diaphragm comprises an LCD panel.

9. The illumination system according to claim 1, further comprising an arrangement of microlenses, each microlens being assigned to one beam deviating element, and the attenuation unit comprises a device by which the optical properties of individual microlenses can be modified.

10. The illumination system according to claim 9, wherein the device comprises an application instrument for applying a light-absorbent coating onto an individual microlens.

11. The illumination system according to claim 10, wherein optical transmission of the microlenses is varied individually so that a microlens through which light would strike a defective beam deviating element is optically blocked.

12. Illumination system according to claim 1, wherein the attenuation unit is configured to modify the optical properties of any of the individual beam deviating elements.

13. The illumination system according to claim 12, wherein the attenuation unit is configured to selectively apply a light-absorbing layer onto any of the beam deviating elements.

14. The illumination system according to claim 12, wherein the attenuation unit is configured to apply a light-deviating optical element onto any of the relevant beam deviating elements.

15. The illumination system according to claim 12, wherein the attenuation unit is configured to destroy any of the beam deviating elements.

16. The illumination system according to claim 15, wherein the attenuation unit is configured to destroy any of the deviating elements as a result of mechanical forces, electrical currents, chemical reactions or action of heat.

17. The illumination system according to claim 12, wherein the attenuation unit comprises an actuation element, which can be arranged in the immediate vicinity of any of the beam deviating elements with the aid of a displacement instrument.

18. The illumination system according to claim 1, wherein the attenuation unit is configured to prevent light coming from any of the beam deviating elements from striking the pupil surface.

19. The illumination system of claim 1, wherein the light assigned to a defective beam deviating element does not strike, or only partially strikes a usable region of the pupil surface.

20. The illumination system of claim 1, wherein the attenuation unit comprises a photo slide with a support made of a material which is at least almost fully optically transparent for the light from the light source, the photo slide having an optically opaque coating in regions in which light passing through would otherwise strike a defective beam deviating element.

21. An illumination system having a beam path between a light source and a pupil surface, comprising:
   a) a first optical system arranged at a first location along the beam path, the first optical system is configured so that, during use of the illumination system, the first optical system produces a bundle of N individual input light beams, wherein N is a positive integer,
   b) an arrangement of N individually drivable beam deviating elements arranged at a second location along the beam path, wherein the arrangement is configured so that, during use of the illumination system, the arrangement produces from the bundle of N individual input light beams a bundle of N individual output light beams whose positions at the pupil surface are variable by control signals applied to the beam deviating elements, and
   c) a beam extinction unit arranged at a third location along the beam path upstream of the pupil surface, the beam extinction unit is configured so that, during use of the illumination system, the beam extinction unit reduces the number of output light beams by k, with $1 \leq k < N$,
wherein:
the second location is different from the third location;
the beam extinction unit is configured to reduce the number of input light beams that impinge on the arrangement of beam deviating elements; and
the illumination system is configured to be used in a microlithographic projection exposure apparatus.

* * * * *

UNITED STATES PATENT AND TRADEMARK OFFICE
CERTIFICATE OF CORRECTION

PATENT NO. : 8,773,639 B2
APPLICATION NO. : 12/632055
DATED : July 8, 2014
INVENTOR(S) : Markus Deguenther, Andras G. Major and Anne Christine Andresen It is certified that error appears in the above-identified patent and that said Letters Patent is hereby corrected as shown below:

In the Specification:

Col. 4, Line 5, Delete "elements" and insert --elements.--, therefor.

Col. 19, Line 46, Delete "thereof" and insert --thereof.--, therefor.

Signed and Sealed this
Seventh Day of October, 2014

Michelle K. Lee
*Deputy Director of the United States Patent and Trademark Office*